(12) United States Patent
Dai et al.

(10) Patent No.: US 11,728,442 B2
(45) Date of Patent: Aug. 15, 2023

(54) BACK CONTACT SOLAR CELL STRING AND PREPARATION METHOD THEREFOR, MODULE, AND SYSTEM

(71) Applicants: Zhejiang Aiko Solar Energy Technology Co., Ltd., Jinhua (CN); Zhuhai Fushan Aiko Solar Energy Technology Co., Ltd., Zhuhai (CN); Tianjin Aiko Solar Energy Technology Co., Ltd., Tianjin (CN); Guangdong Aiko Solar Energy Technology Co., Ltd., Foshan (CN)

(72) Inventors: Wei Dai, Jinhua (CN); Xinqiang Yang, Jinhua (CN); Gang Chen, Jinhua (CN)

(73) Assignees: ZHEJIANG AIKO SOLAR ENERGY TECHNOLOGY CO., LTD., jINHUA (CN); ZHUHAI FUSHAN AIKO SOLAR ENERGY TECHNOLOGY CO., LTD., Zhuhai (CN); TIANJIN AIKO SOLAR ENERGY TECHNOLOGY CO., LTD., Tianjin (CN); GUANGDONG AIKO SOLAR ENERGY TECHNOLOGY CO., LTD., Foshan (CN)

( * ) Notice: Subject to any disclaimer, the term of this patent is extended or adjusted under 35 U.S.C. 154(b) by 0 days.

(21) Appl. No.: 17/527,090

(22) Filed: Nov. 15, 2021

(65) Prior Publication Data
US 2023/0021066 A1    Jan. 19, 2023

(30) Foreign Application Priority Data
Jul. 15, 2021 (CN) .......................... 202110799134.4

(51) Int. Cl.
*H01L 31/02* (2006.01)
*H01L 31/054* (2014.01)
(Continued)

(52) U.S. Cl.
CPC .... *H01L 31/0201* (2013.01); *H01L 31/02167* (2013.01); *H01L 31/02363* (2013.01);
(Continued)

(58) Field of Classification Search
CPC ........... H01L 31/02167; H01L 31/0201; H01L 31/022425; H01L 31/02363;
(Continued)

(56) References Cited

U.S. PATENT DOCUMENTS

| 2008/0216887 A1* | 9/2008 | Hacke | H01L 31/0516 |
| | | | 257/E31.11 |
| 2009/0183759 A1* | 7/2009 | Hishida | H01L 31/0516 |
| | | | 136/244 |

(Continued)

FOREIGN PATENT DOCUMENTS

| CN | 103928555 A | * | 7/2014 |
| CN | 106098831 A | | 11/2016 |

(Continued)

*Primary Examiner* — Mayla Gonzalez Ramos
(74) *Attorney, Agent, or Firm* — Matthias Scholl P.C.; Matthias Scholl

(57) ABSTRACT

A back contact solar cell string includes: at least two cell pieces, where each cell piece comprises positive electrode regions and negative electrode regions alternately disposed with each other; insulation layers, covering the positive electrode regions on one side of the cell piece and the negative electrode regions on another side of the cell piece; and a first bus bar, connected to two adjacent cell pieces and electrically connected to the positive electrode regions and the negative electrode regions in the two adjacent cell pieces that are not covered by the insulation layers.

17 Claims, 7 Drawing Sheets

(51) Int. Cl.
*H01L 31/0216* (2014.01)
*H01L 31/0224* (2006.01)
*H01L 31/0236* (2006.01)
*H01L 31/18* (2006.01)

(52) U.S. Cl.
CPC .. *H01L 31/022441* (2013.01); *H01L 31/0547* (2014.12); *H01L 31/18* (2013.01)

(58) Field of Classification Search
CPC ......... H01L 31/022441; H01L 31/0516; H01L 31/0547; H01L 31/18
See application file for complete search history.

(56) References Cited

U.S. PATENT DOCUMENTS

| | | | |
|---|---|---|---|
| 2010/0031999 A1* | 2/2010 | Mishima | H01L 31/022433 |
| | | | 136/244 |
| 2011/0120530 A1* | 5/2011 | Isaka | H01L 31/0516 |
| | | | 136/251 |
| 2015/0059831 A1* | 3/2015 | Fukumochi | H01L 31/0547 |
| | | | 136/246 |
| 2018/0204968 A1* | 7/2018 | Zhang | H01L 31/0516 |

FOREIGN PATENT DOCUMENTS

| | | | |
|---|---|---|---|
| EP | 2575184 A2 | 4/2013 | |
| EP | 2958152 A1 | 12/2015 | |
| EP | 3608974 A1 | 2/2020 | |

\* cited by examiner

BACK CONTACT SOLAR CELL STRING AND PREPARATION METHOD THEREFOR, MODULE, AND SYSTEM

CROSS-REFERENCE TO RELATED APPLICATIONS

Pursuant to 35 U.S.C. § 119 and the Paris Convention Treaty, this application claims foreign priority to Chinese Patent Application No. 202110799134.4 filed Jul. 15, 2021, the contents of which, including any intervening amendments thereto, are incorporated herein by reference. Inquiries from the public to applicants or assignees concerning this document or the related applications should be directed to: Matthias Scholl P. C., Attn.: Dr. Matthias Scholl Esq., 245 First Street, 18th Floor, Cambridge, Mass. 02142.

BACKGROUND

The disclosure relates to the field of solar cells, and in particular, to a back contact solar cell string and a preparation method therefor, a module, and a system.

A solar cell is a semiconductor device capable of converting light energy to electric energy. The solar cell industry pursues low production costs and high energy conversion efficiency. For a conventional solar cell, an emitter contact electrode and a base contact electrode thereof are respectively located on two opposite sides of a cell piece. The front side of the cell is a light-receiving surface. When the front metal emitter contact electrode is covered, part of the incident sunlight is reflected and shielded by the metal electrode, resulting in an optical loss. The front metal electrode of a common crystalline silicon solar cell is covered by about 7% in area. The energy conversion efficiency of the cell may be directly enhanced by reducing the covering of the front metal electrode. A back contact solar cell is a cell in which contact electrodes of emitter and base are both disposed on a back side (a non-light-receiving surface) of the cell. The front surface without metal electrode of back contact cells increases the light-receiving area, effectively increasing the short-circuit current of a cell piece. In addition, a relatively wide metal grid line is allowed to exist on the back side of back contact cells to reduce the serial resistance, thereby increasing the fill factors. The cell without front shielding not only has high conversion efficiency, but also has a more pleasing appearance. In addition, a module having electrodes all disposed on a back side is easy to assemble.

Conventional back contact solar cells are serially connected to form a cell string, which then undergoes other manufacturing processes to form a cell module. However, since there is a relatively large quantity of emitter and base contact electrodes, and the emitter and the base contact electrodes have relatively small wire widths, it is very difficult to achieve cell alignment between adjacent cell pieces for welding during serial connection of the back contact solar cells into the cell string. When the emitter and the base contact electrodes are connected during the cell alignment for welding, a short circuit of the cell piece is caused. Thus, accurate cell alignment is required during welding, and process requirements are relatively complex.

SUMMARY

The technical problem to be resolved in the disclosure is to provide a back contact solar cell string, to resolve the problems such as the requirement for accurate cell alignment and the complexity of the process during the manufacturing of a conventional cell string.

In order to resolve the above technical problem, the disclosure provides a back contact solar cell string. The back contact solar cell string comprises:

at least two cell pieces, where each cell piece comprises positive electrode regions and negative electrode regions alternately disposed with each other;

insulation layers, covering the positive electrode regions on one side of the cell piece and the negative electrode regions on another side of the cell piece; and a first bus bar, connected to two adjacent cell pieces and electrically connected to the positive electrode regions and the negative electrode regions in the two adjacent cell pieces that are not covered by the insulation layers.

In a class of this embodiment, solder joints are disposed in the positive electrode regions and the negative electrode regions on the cell pieces that are electrically connected to the first bus bar.

In a class of this embodiment, conductive adhesives or solder pastes are disposed at connection portions between the first bus bar and the positive electrode regions and the negative electrode regions on the cell pieces.

In a class of this embodiment, the conductive adhesives or the solder pastes are disposed on the first bus bar.

In a class of this embodiment, the first bus bar comprises a main body portion and extending portions each extending from the main body portion and connected to the positive electrode regions and the negative electrode regions.

In a class of this embodiment, a reflection structure is disposed on the main body portion.

In a class of this embodiment, the reflection structure is a roughly textured structure, a reflective layer coated on the main body portion, or a reflective film attached to the main body portion.

In a class of this embodiment, the reflective film is an aluminum film.

In a class of this embodiment, the reflection structure is located in a gap between the two adjacent cell pieces.

In a class of this embodiment, the insulation layers comprise insulation pastes.

In a class of this embodiment, the first bus bar is a pressure-sensitive conductive adhesive tape or a ribbon.

In a class of this embodiment, the cell string further comprises second bus bars located on end portions of the solar cell string, and the second bus bars are electrically connected to the positive electrode regions and the negative electrode regions in the cell pieces located on the end portions that are not covered by the insulation layers.

In a class of this embodiment, a quantity of the solder joints is in a range of 2-20.

Correspondingly, the disclosure further provides a cell module. The cell module comprises the back contact solar cell string described above.

Correspondingly, the disclosure further provides a photovoltaic system. The photovoltaic system comprises the cell module described above.

Correspondingly, the disclosure further provides a method for preparing a back contact solar cell string. The method comprises:

respectively disposing insulation layers in each positive electrode region on one side of each cell piece and in each negative electrode region on another side of each cell piece; and connecting a first bus bar to the positive electrode regions and the negative electrode regions in two adjacent cell pieces that are not covered by the insulation layers.

In a class of this embodiment, connecting the first bus bar to the positive electrode regions and the negative electrode regions in the two adjacent cell pieces that are not covered by the insulation layers comprises:

disposing a conductive adhesive or a solder paste on the first bus bar; and connecting, by using the conductive adhesive or the solder paste, the first bus bar to the positive electrode regions and the negative electrode regions in the two adjacent cell pieces that are not covered by the insulation layers.

In a class of this embodiment, connecting the first bus bar to the positive electrode regions and the negative electrode regions in the two adjacent cell pieces that are not covered by the insulation layers comprises:

disposing, on the cell pieces, busbars or wires connected to the positive electrode regions and the negative electrode regions not covered by the insulation layers; and connecting the first bus bar to the busbars or the wires in the two adjacent cell pieces.

In a class of this embodiment, connecting the first bus bar to the positive electrode regions and the negative electrode regions in the two adjacent cell pieces that are not covered by the insulation layers comprises:

disposing solder joints in the positive electrode regions and the negative electrode regions on the cell pieces that are not covered by the insulation layers; and connecting the first bus bar to the solder joints in the positive electrode regions and the negative electrode regions in the two adjacent cell pieces that are not covered by the insulation layers.

In a class of this embodiment, the method further comprises:

connecting second bus bars to the positive electrode regions or the negative electrode regions in the cell pieces located on end portions that are not covered by the insulation layers.

The disclosure has the following beneficial effects:

The positive electrode regions and the negative electrode regions on the cell pieces that are not required to be electrically connected are covered by using the insulation layers, and the first bus bars can be directly connected to all of the positive electrode regions and the negative electrode regions on the cell pieces. The insulation layers are disposed, so that the positive electrode regions and the negative electrode regions not required to be electrically connected are insulated from the first bus bars by using the insulation layers, and the positive electrode regions and the negative electrode regions required to be electrically connected are directly electrically connected to the first bus bars. In this way, the requirement for accurate cell alignment during the manufacturing of the cell string is reduced, and the process is simplified, thereby resolving the requirement for accurate cell alignment and the complexity of a process during the manufacturing of a conventional cell string. The reflection structures are disposed on the first bus bars, so that light can be reflected back to glass in a manufactured cell module, and then reflected to an adjacent cell piece through the glass, and the adjacent cell piece can absorb the light irradiated on the first bus bars. In this way, secondary reflection and utilization of the light irradiated on the cell module can be increased, thereby enhancing the power.

DETAILED DESCRIPTION

To make the objectives, technical solutions and advantages of the disclosure clearer and more comprehensible, the disclosure is further described in detail below with reference to the accompanying drawings and embodiments. It is to be understood that the specific embodiments described herein are merely used to explain the disclosure, but are not intended to limit the disclosure.

In the disclosure, unless otherwise explicitly specified or defined, the terms such as "mount", "install", "connect", "connection", and "fix" should be understood in a broad sense. For example, the connection may be a fixed connection, a detachable connection, or an integral connection; or the connection may be a mechanical connection or an electrical connection; or the connection may be a direct connection, an indirect connection through an intermediary, or internal communication between two components. A person of ordinary skill in the art may understand specific meanings of the foregoing terms in the disclosure according to specific situations. The term "and/or" used in this specification comprises any and all combinations of one or more related listed items.

According to the disclosure, positive electrode regions and negative electrode regions on cell pieces that are not required to be electrically connected are covered by using insulation layers, and first bus bars can be directly connected to all of the positive electrode regions and the negative electrode regions on the cell pieces. The insulation layers are disposed, so that the positive electrode regions and the negative electrode regions not required to be electrically connected are insulated from the first bus bars by using the insulation layers, and the positive electrode regions and the negative electrode regions required to be electrically connected are directly electrically connected to the first bus bars. In this way, the requirement for accurate cell alignment during the manufacturing of a cell string is reduced, and the process is simplified, thereby resolving the requirement for accurate cell alignment and the complexity in a process during the manufacturing of the conventional cell string. The reflection structures are disposed on the first bus bars, so that light can be reflected back to glass in a manufactured cell module, and then reflected to an adjacent cell piece through the glass, and the adjacent cell piece can absorb the light irradiated on the first bus bars. In this way, secondary reflection and utilization of the light irradiated on the cell module can be increased, thereby enhancing the power.

Example 1

Figure 1:
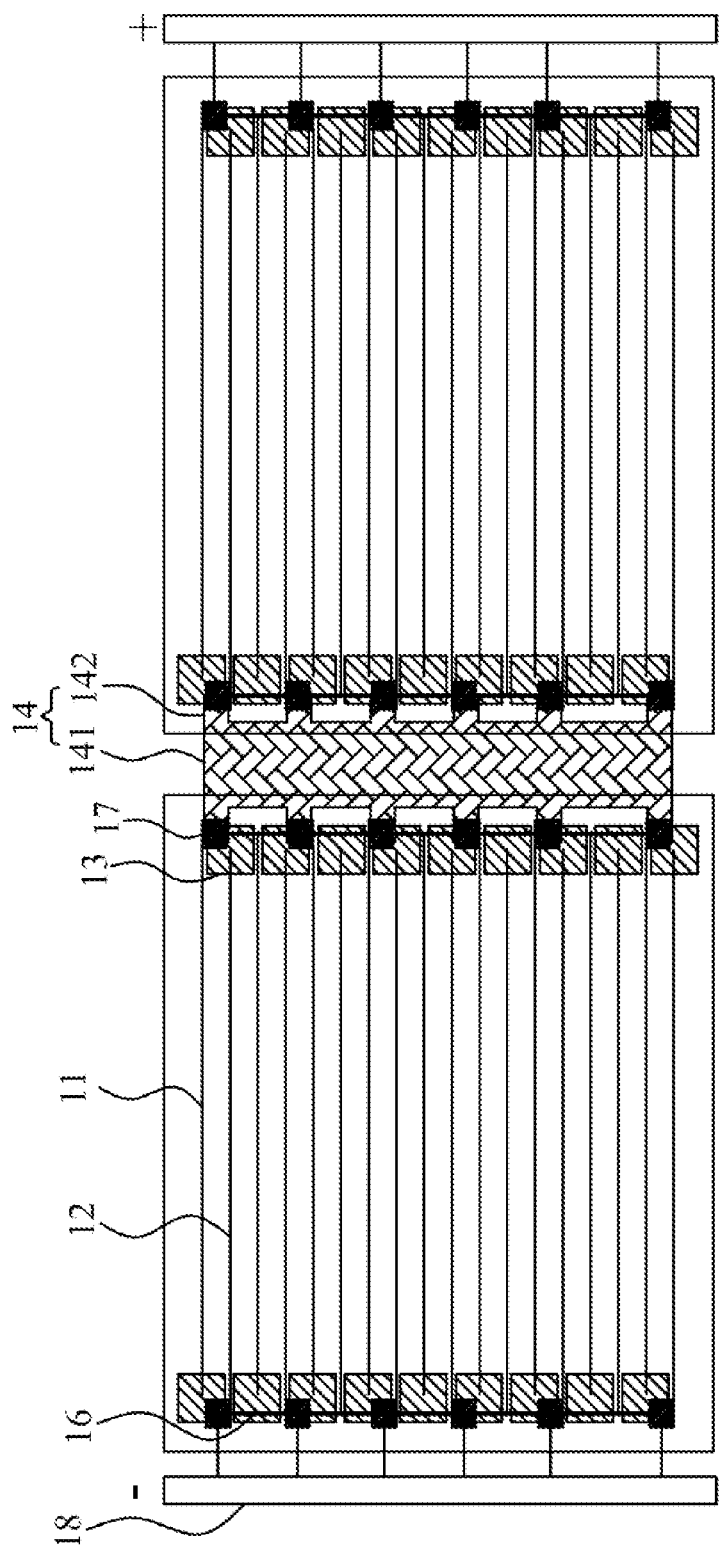
FIG. 1 is a schematic structural diagram of a back contact solar cell string according to an embodiment of the disclosure.

FIG. 1 is a schematic structural diagram of a back contact solar cell string according to an embodiment of the disclosure. For ease of description, only parts related to this embodiment of the disclosure are shown. The back contact solar cell string provided in this embodiment of the disclosure comprises:

at least two cell pieces, where each cell piece comprises positive electrode regions 11 and negative electrode regions 12 alternately disposed;

insulation layers 13, covering the positive electrode regions 11 on one side of the cell piece and the negative electrode regions 12 on an other side of the cell piece; and first bus bars 14, connected to two adjacent cell pieces and electrically connected to the positive electrode regions 11 and the negative electrode regions 12 in the two adjacent cell pieces that are not covered by the insulation layers 13.

Figure 2:
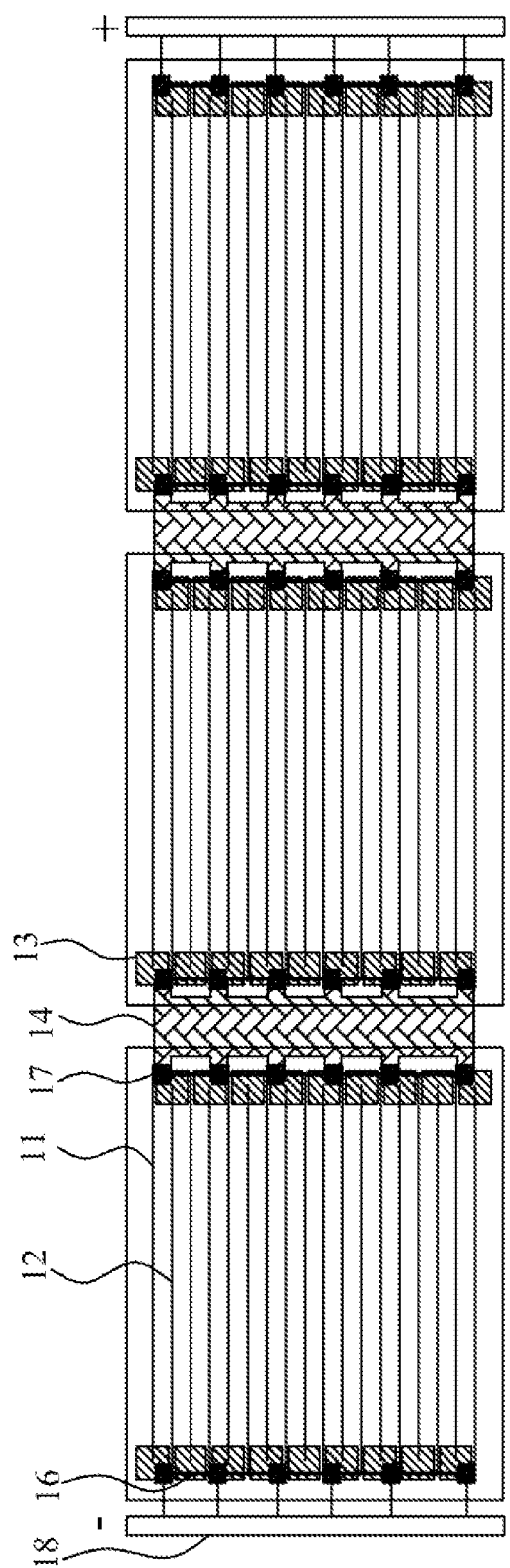
FIG. 2 is a schematic structural diagram of a back contact solar cell string according to another embodiment of the disclosure.

In an embodiment of the disclosure, the back contact solar cell string is a cell string formed by serially connecting at least two cell pieces (that is, back contact solar cells) together using the first bus bar 14 disposed between each two cell pieces. The cell string may comprise two cell pieces, three cell pieces, or other quantities of cell pieces that are serially connected to each other. FIG. 1, FIG. 3, FIG. 4, and FIG. 5 show a cell string formed by two cell pieces serially connected to each other. In this case, only one first bus bar 14 is required to be connected to the two adjacent cell pieces. In other embodiments of the disclosure, FIG. 2 shows a cell string comprising three cell pieces serially connected to each other. In this case, two first bus bar 14 are required to be respectively connected to the two adjacent cell pieces. It may be understood that, the cell string may also comprise other quantities of cell pieces serially connected to each other according to actual use requirements, which is not completely shown in the figure. The cell string is designed according to actual requirements. The cell pieces at two end portions of the cell string are defined as end cell pieces. When the cell string comprises a plurality of cell pieces serially connected to each other, the cell pieces serially connected between the two end cell pieces are defined as internal cell pieces.

In an example of the disclosure, the cell pieces each comprise a front passivation and anti-reflection layer, a silicon substrate, a back tunneling layer, N-type doped regions and P-type doped regions alternately disposed, a back passivation layer, and a cell electrode from top to bottom. The N-type doped regions and the P-type doped regions are alternately disposed on a lower surface of the back tunneling layer. The cell electrode comprises positive electrode thin grid lines and negative electrode thin grid lines. The positive electrode thin grid lines are electrically connected to the P-type doped region to form the positive electrode regions 11. The negative electrode thin grid lines are electrically connected to the N-type doped region to form the negative electrode regions 12. It may be understood that, in other embodiments of the disclosure, a structure of the cell piece may also be designed differently, which is not limited herein. It is to be noted that, in a cell piece of any structural type, the positive electrode thin grid lines are disposed in the P-type doped region to form the positive electrode regions 11, the negative electrode thin grid lines are disposed in the N-type doped region to form the negative electrode regions 12, and the positive electrode regions 11 and the negative electrode regions 12 are all disposed on a back side of the cell piece. During printing of the positive electrode thin grid lines and the negative electrode thin grid lines, the positive electrode thin grid lines and the negative electrode thin grid lines may extend to end portions of the cell piece. Alternatively, a specific distance may be designed between ends of the positive electrode thin grid lines and the negative electrode thin grid lines and the end portions of the cell piece.

Further, in an embodiment of the disclosure, FIG. 1 is a back view of the cell string. The cell string comprises a plurality of positive electrode regions 11 and negative electrode regions 12 that are alternately disposed. All of the positive electrode regions 11 and the negative electrode regions 12 are substantially parallel to an edge of the cell piece and are alternately disposed. The cell pieces are substantially in rectangular shapes. The expression "the cell pieces are substantially rectangular cell pieces" means that, for example, the cell pieces may be in square shapes, or may be in another rectangular shape, and may have standard corners, cut corners, or rounded corner. The cell pieces are designed according to actual production requirements, which are not specifically limited herein. Quantities of the positive electrode regions 11 and the negative electrode regions 12 are determined according to actual sizes of the cell pieces and widths of the positive electrode thin grid lines and the negative electrode thin grid lines and distances therebetween, which are not specifically limited herein.

Further, in an embodiment of the disclosure, as shown in FIG. 1 to FIG. 5, the positive electrode regions 11 on one side of each cell piece are covered by the insulation layers 13, and the negative electrode regions 12 on another side of each cell piece are also covered by the insulation layers 13. Specifically, for example, when the insulation layers 13 are coated on the positive electrode regions 11 on a left side of each cell piece, the insulation layers 13 are correspondingly coated on the negative electrode regions 12 on a right side of each cell piece. In an embodiment of the disclosure, the insulation layers 13 may be insulation pastes, or may be non-conductive adhesive tapes or insulation films, or may be other proper non-conductive shields or covers. The insulation layers 13 may comprise materials such as polypropylene, polyethylene, or polyimide, and may further comprise acrylic bonding layers. In addition, the insulation layers 13 may be in circular shapes, square shapes, triangular shapes, or other shapes. The shapes and materials of the insulation layers 13 may be designed according to actual use requirements, provided that the insulation layers can realize insulation between the positive electrode regions 11 or the negative electrode regions 12 that are covered and the outside, which are not specifically limited herein. The insulation layers 13 may be preferably spread outward by using ends of the positive electrode regions 11 or the negative electrode regions 12 that are required to be covered as centers. The insulation layers 13 may be coated from the ends of the positive electrode regions 11 to the end portions of the cell pieces. In this case, one region (the positive electrode region 11 or the negative electrode region 12) on one side of the cell piece is covered by the insulation layers 13, and another region is not covered by the insulation layers 13, so that the region not covered by the insulation layers 13 may be connected to the outside, and the region covered by the insulation layers 13 may be insulated from the outside.

It is to be noted that, specifically, in order to realize serial connection between the cell pieces, connection is established from a polarity of a cell piece to another polarity of a next adjacent cell piece by using the first bus bar 14, to achieve the connection between the cell pieces. Thus, in this embodiment, during the serial connection between the cell pieces by using the first bus bar 14, the first bus bar 14 is electrically connected to the positive electrode regions 11 and the negative electrode regions 12 in the two adjacent cell pieces that are not covered by the insulation layers 13. That is to say, for example, on the two cell pieces, the positive electrode regions 11 on a left side are covered by the insulation layers 13 and the negative electrode regions 12 on a right side are covered by the insulation layers 13. In this case, the negative electrode regions 12 are insulated from the first bus bar 14 by means of the insulation layers 13 disposed on the right side of the end cell piece on a left side, and the positive electrode regions 11 not covered by the insulation layers 13 are electrically connected to the first bus bar 14. Correspondingly, the positive electrode regions 11 are insulated from the first bus bar 14 by means of the insulation layers 13 disposed on the left side of the end cell piece on a right side, and the negative electrode regions 12 not covered by the insulation layers 13 are electrically connected to the first bus bar 14. In this way, the positive electrode regions 11 of the end cell piece on the left side are connected to the negative electrode regions 12 of the adjacent end cell piece on the right side by using the first bus bar 14. It is to be noted that, a connection range of the connection between the first bus bar 14 and the two adjacent cell pieces does not exceed a coverage of the insulation layers 13, so that the first bus bar 14 is insulated from the positive electrode regions 11 or the negative electrode regions 12 that are covered by the insulation layers 13. In this case, a current in the negative electrode regions 12 of the end cell piece on the left side flows from inside of the cell piece to the adjacent positive electrode regions 11. The positive electrode regions 11 are electrically connected to the first bus bar 14, so that a current in the positive electrode regions 11 of the end cell piece on the left side flows to the negative electrode regions 12 of the end cell piece on the right side by using the first bus bar 14, and further flows from the inside of the end cell piece on the right side to the adjacent positive electrode regions 11. Therefore, the serial connection between cell pieces is realized. It is to be understood that, when there are 3 or other quantities of cell pieces, the cell pieces are correspondingly electrically connected to each other by using the first bus bars 14. The first bus bars 14 are respectively connected to the positive electrode regions 11 and the negative electrode regions 12 in the respective two adjacent cell pieces that are not covered by the insulation layers 13. Left sides of all of the first bus bars 14 are all electrically connected to the positive electrode regions 11, and right sides of the first bus bars are all electrically connected to the negative electrode regions 12. Therefore, the serial connection between cell pieces is realized. In this way, the current may flow from one cell piece to the next adjacent cell piece by using the first bus bars 14, and is finally exported.

Figure 3:
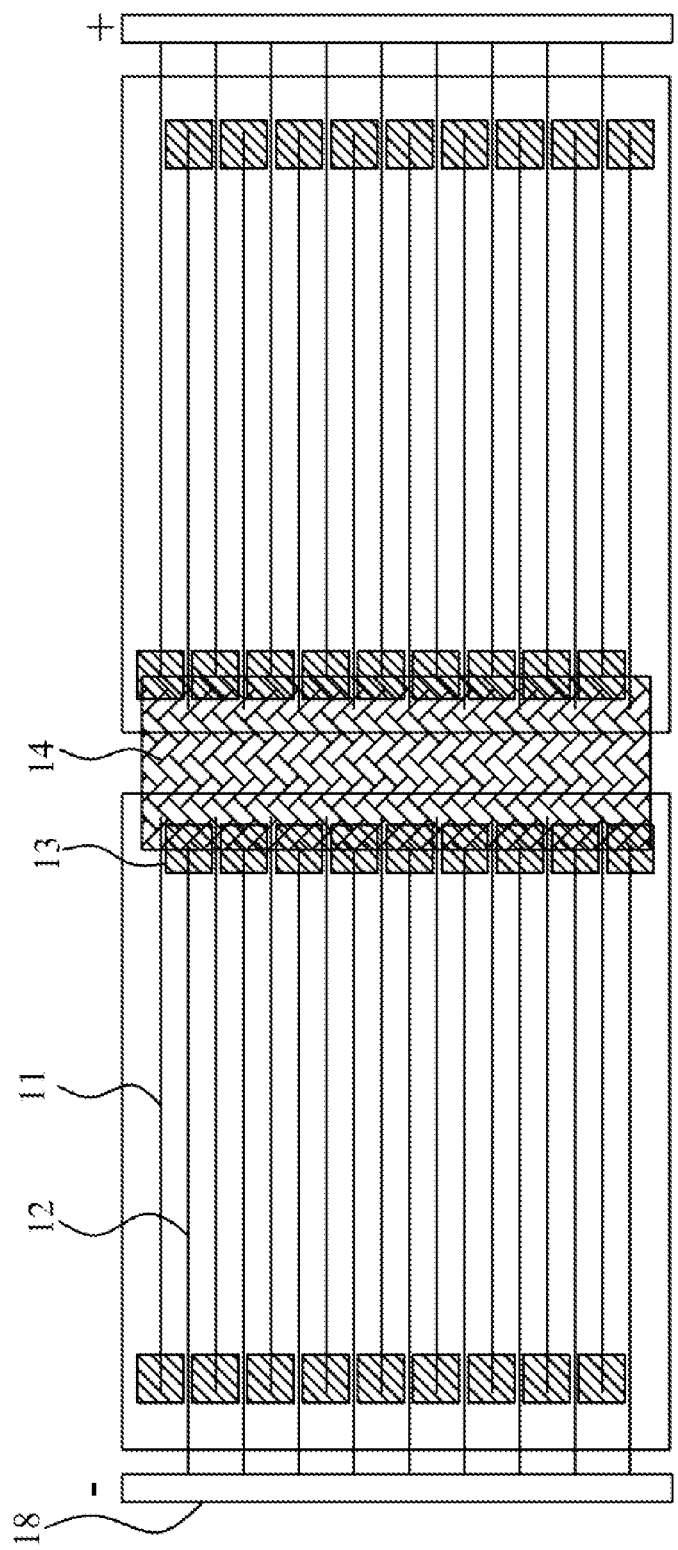
FIG. 3 is a schematic structural diagram of a back contact solar cell string according to still another embodiment of the disclosure.
Figure 6:
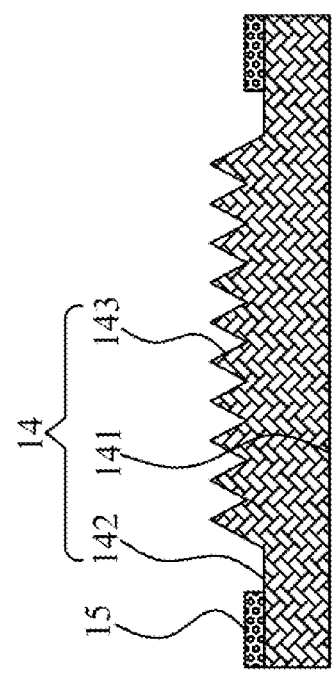
FIG. 6 is a schematic structural diagram related to a first bus bar in a back contact solar cell string according to an embodiment of the disclosure.

Further, in an embodiment of the disclosure, as shown in FIG. 3, the positive electrode regions 11 and the negative electrode regions 12 on each cell piece that are not covered by the insulation layers 13 may be directly electrically connected to the first bus bar 14. Conductive adhesives or solder pastes 15 are disposed at connection portions between the first bus bar 14 and the positive electrode regions 11 and the negative electrode regions 12 on the cell piece. Optionally, the conductive adhesives or the solder pastes 15 are directly coated in the positive electrode regions 11 and the negative electrode regions 12 on the cell piece that are not covered by the insulation layers 13. In this case, the first bus bar 14 can directly come into contact with the conductive adhesives or the solder pastes 15 during connection to the cell piece, so that more desirable electrical connection and physical connection with the positive electrode regions 11 and the negative electrode regions 12 that are required to be connected are realized. However, the conductive adhesives or the solder pastes 15 are required to be successively disposed in each positive electrode region 11 and each negative electrode region 12 that are not covered by the insulation layers 13, which is relatively cumbersome. In addition, in order to avoid a short circuit caused by the coating of the conductive adhesives or the solder pastes 15 to the adjacent positive electrode regions 11 or negative electrode regions 12 covered by the insulation layers 13, the conductive adhesives or the solder pastes 15 are required to be coated accurately enough. As shown in FIG. 6, alternatively, the conductive adhesives or the solder pastes 15 are coated on the first bus bar 14, that is, the conductive adhesives or the solder pastes 15 are disposed on the first bus bar 14. In this case, the conductive adhesives or the solder pastes 15 disposed on the first bus bar 14 are merely required to be controlled not to exceed the coverage of the insulation layers 13. Thus, the conductive adhesives or the solder pastes 15 may be directly completely and continuously disposed on a periphery of the first bus bar 14. In this way, during connection of the first bus bar 14 to the cell piece, the first bus bar 14 can be electrically connected to each positive electrode region 11 and each negative electrode region 12 that are not covered by the insulation layers 13 more desirably by using the conductive adhesives or the solder pastes 15. By means of the insulation layers 13, even if the conductive adhesives or the solder pastes 15 disposed on the first bus bar 14 cover the insulation layers 13, the first bus bar is still prevented from being electrically connected to the negative electrode regions 12 or the positive electrode regions 11 that are covered by the insulation layers 13. In this case, the negative electrode regions 12 or the positive electrode regions 11 that are covered by the insulation layers 13 are successively covered by the insulation layers 13, the conductive adhesives or the solder pastes 15, and the first bus bar 14. Therefore, coating the conductive adhesives or the solder pastes 15 on the first bus bar 14 is a convenient and rapid process operation.

Figure 4:
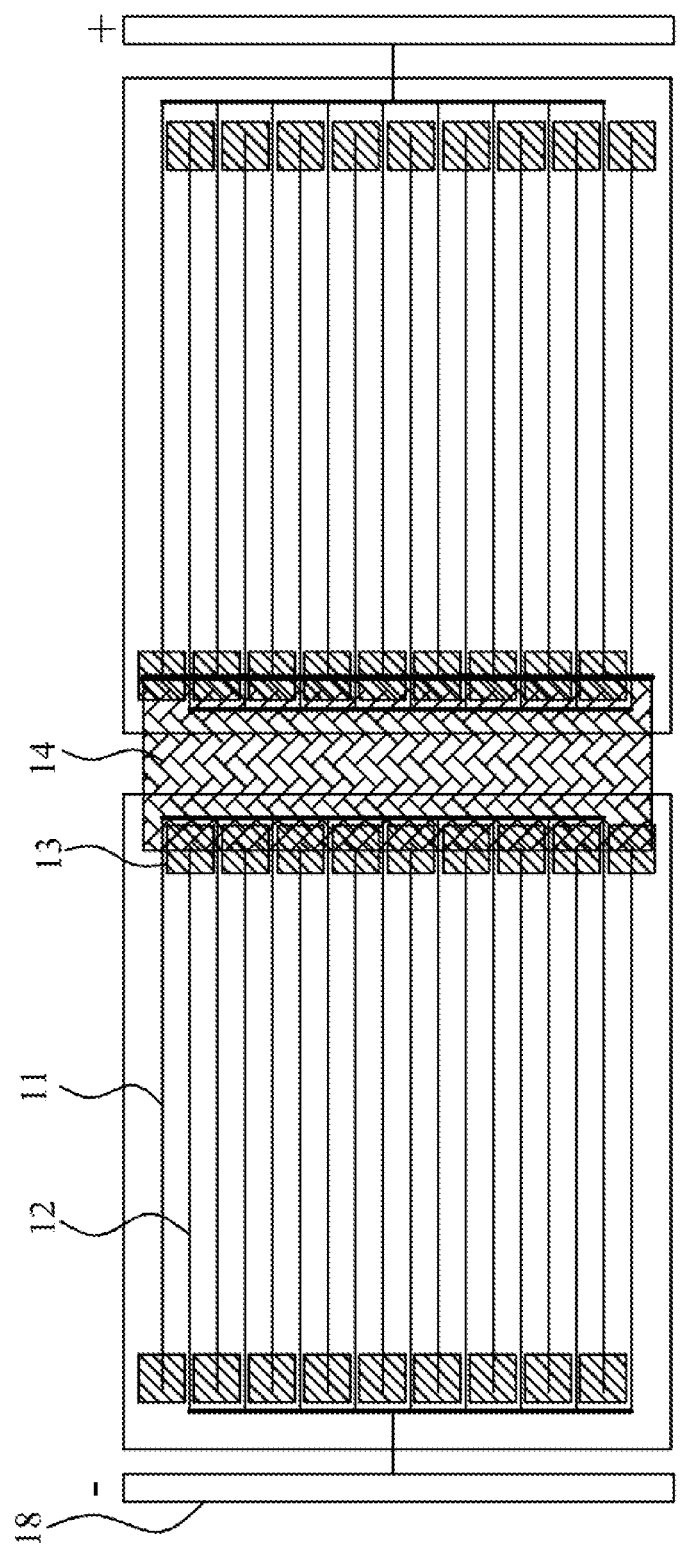
FIG. 4 is a schematic structural diagram of a back contact solar cell string according to yet another embodiment of the disclosure.

Further, in an embodiment of the disclosure, as shown in FIG. 4, busbars or wires 16 connected to each positive electrode region 11 or each negative electrode region 12 that is not covered by the insulation layers 13 are further disposed on each cell piece. Specifically, for example, when the positive electrode regions 11 on one side of the cell piece are covered by the insulation layers 13, the negative electrode regions 12 not covered by the insulation layers 13 may be connected to the busbars or the wires 16. In this way, a current in each negative electrode region 12 may be converged to the busbars or the wires 16. Correspondingly, the first bus bar 14 is electrically connected to the positive electrode regions 11 and the negative electrode regions 12 in the two adjacent cell pieces that are not covered by the insulation layers 13 mainly by using the busbars or the wires 16. By means of the insulation layers 13, each positive electrode region 11 or each negative electrode region 12 that is covered by the insulation layers 13 is prevented from being connected to the first bus bar 14. Correspondingly, referring to the above, the conductive adhesives or the solder pastes 15 are disposed on the connection portions between the first bus bar 14 and the positive electrode regions 11 and the negative electrode regions 12 on the cell pieces. Specifically, the conductive adhesives or the solder pastes 15 may be coated on the busbars or the wires 16. Alternatively, the conductive adhesives or the solder pastes 15 may be directly coated on the first bus bar 14. Further, in an embodiment of the disclosure, as shown in FIG. 1, during the preparation of the cell piece, the positive electrode regions 11 having a same polarity may all be disposed close to one side, and the negative electrode regions 12 are all disposed close to an other side. For example, the positive electrode regions 11 on the left side on the cell piece are coated with the insulation layers 13, and the negative electrode regions 12 on the right side are coated with the insulation layers 13. In this case, the negative electrode regions 12 are disposed close to the left side, and the positive electrode regions 11 are disposed close to the right side. Therefore, the negative electrode regions 12 on the left side may be caused to protrude out of the positive electrode regions 11 coated with the insulation layers 13, so that the negative electrode regions 12 on the left side do not come into contact with the positive electrode regions 11 during connection to the busbars or the wires 16. Therefore, the positive electrode regions 11 not only realizes insulation from the outside by using the insulation layers 13 covered thereon, but also do not come into contact with the busbars or the wires 16 by means of an offset position. Definitely, in other embodiments of the disclosure, the positive electrode regions 11 and the negative electrode regions 12 are all regularly and alternately disposed on a back side of the cell piece. In this case, the insulation layers 13 are required to be coated first, and then the busbars or the wires 16 are disposed.

Figure 5:
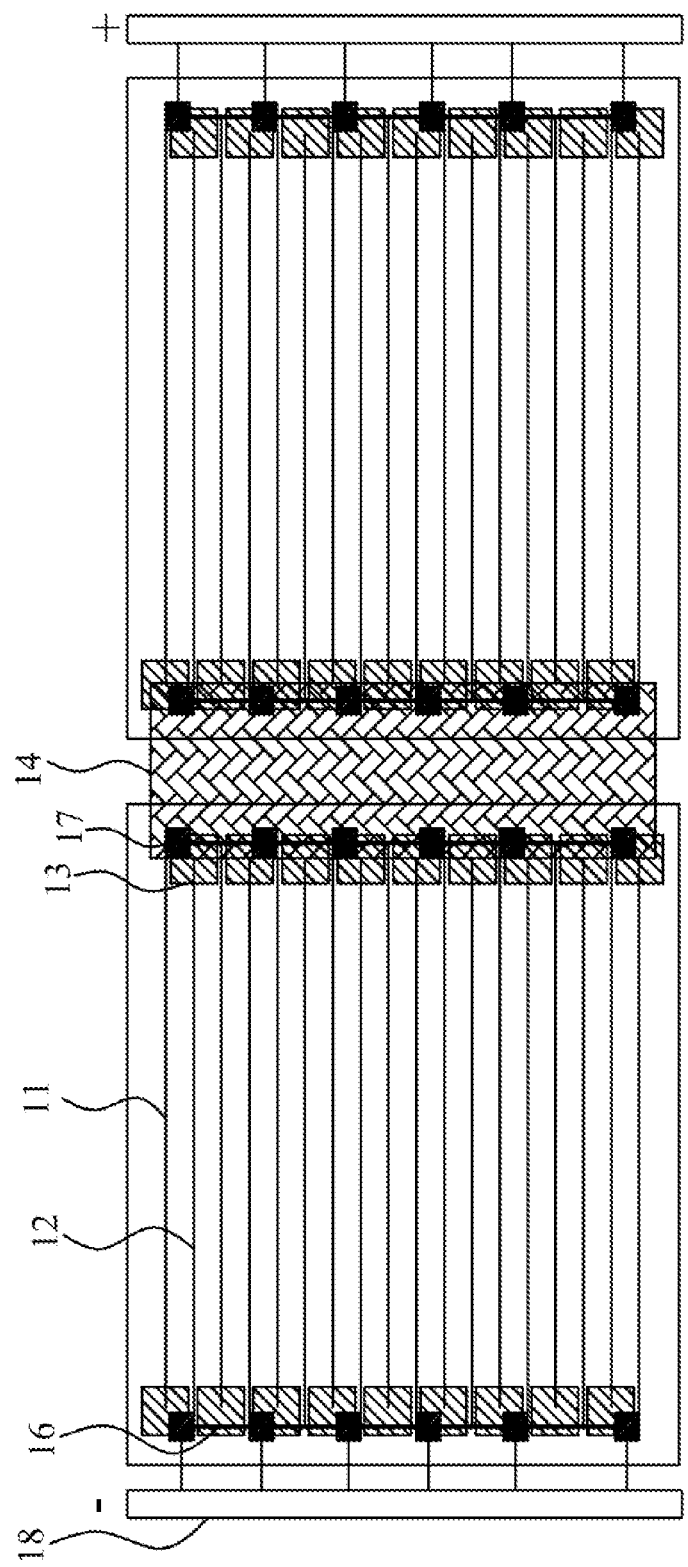
FIG. 5 is a schematic structural diagram of a back contact solar cell string according to yet another embodiment of the disclosure.

Further, in an embodiment of the disclosure, as shown in FIG. 1, FIG. 2, and FIG. 5, on each cell piece, solder joints 17 (pads) may be further disposed on the busbars or the wires 16. That is to say, the solder joints 17 are disposed in the positive electrode regions 11 and the negative electrode regions 12 of the cell piece that are electrically connected to the first bus bar 14. A plurality of solder joints 17 are disposed on the busbars or the wires 16, so as to achieve more desirable electrical connection and physical connection to the first bus bar 14 by using the solder joints 17. A quantity of the solder joints 17 is in a range of 2-20. That is to say, not all of the positive electrode regions 11 or the negative electrode regions 12 on the cell piece that are electrically connected to the first bus bar 14 have the solder joints 17 disposed thereon. The solder joints 17 may be disposed in part of the positive electrode regions 11 or the negative electrode regions 12. The rest of the positive electrode regions 11 or the negative electrode regions 12 are directly connected to the busbars or the wires 16. Correspondingly, the first bus bar 14 is electrically connected to the positive electrode regions 11 and the negative electrode regions 12 in the two adjacent cell pieces that are not covered by the insulation layers 13 respectively by using the solder joints 17 and the busbars or the wires 16. By means of the insulation layers 13, each positive electrode region 11 or each negative electrode region 12 that is covered by the insulation layers 13 is prevented from being connected to the first bus bar 14. Correspondingly, referring to the above, the conductive adhesives or the solder pastes 15 are disposed on the connection portions between the first bus bar 14 and the positive electrode regions 11 and the negative electrode regions 12 on the cell pieces. Specifically, the conductive adhesives or the solder pastes 15 may be coated on the solder joints 17. Alternatively, the conductive adhesives or the solder pastes 15 may be directly coated on the first bus bar 14.

Further, in an embodiment of the disclosure, the first bus bar 14 is a pressure-sensitive conductive adhesive tape or a ribbon. The first bus bar 14 comprises a main body portion 141 and extending portions 142 each extending from the main body portion 141 and connected to the positive electrode regions 11 and the negative electrode regions 12. Preferably, as shown in FIG. 1, the extending portions 142 extend from the main body portion 141 to form a finger-like shape or a comb-like shape. Correspondingly, the solder joints 17 are alternately disposed, so that the solder joints 17 disposed in the positive electrode regions 11 in a cell piece that are required to be electrically connected correspond to the solder joints 17 disposed in the negative electrode regions 12 in an adjacent cell piece that are required to be electrically connected, thereby achieving corresponding connection between the first bus bar 14 and the solder joints 17. Since each extending portion 142 is connected to only each positive electrode region 11 or each negative electrode region 12 on the cell piece that is not covered by the insulation layers 13, and is not connected to each adjacent negative electrode region 12 or each adjacent positive electrode region 11 that is covered by the insulation layers 13, physical disconnection between the first bus bar 14 and the negative electrode regions 12 or the positive electrode regions 11 that are covered by the insulation layers 13 can be realized on the basis of the insulation layers 13. In this way, the short circuit caused by the connection between the negative electrode regions 12 or the positive electrode regions 11 that are not completely covered by the insulation layers 13 and the first bus bar 14 is avoided. Definitely, optionally, as shown in FIG. 5, the extending portions may also extend to be fused into a whole. That is to say, the first bus bar 14 may comprise the main body portion and two extending portions extending from two ends of the main body portion. The extending portions are connected to the corresponding positive electrode regions 11 or negative electrode regions 12 that are not covered by the insulation layers. In this case, by means of the insulation layers 13, the positive electrode regions 11 or the negative electrode regions 12 that are covered by the insulation layers 13 are prevented from being connected to the first bus bar 14.

Further, in an embodiment of the disclosure, as shown in FIG. 6, a reflection structure 143 is disposed on the main body portion 141. The reflection structure 143 is located in a gap between two adjacent cell pieces. Specifically, during assembling of the cell pieces into a cell module, the two adjacent cell pieces are not completely tightly attached to each other. Instead, a specific gap exists therebetween. In this embodiment, the reflection structure 143 is disposed on the main body portion 141, and the reflection structure 143 is located in the gap between the two adjacent cell pieces. When the first bus bar 14 is connected to the two adjacent cell pieces, the extending portions 142 on the two ends of the main body portion 141 are electrically connected to the positive electrode regions 11 and the negative electrode regions 12 in the two adjacent cell pieces that are not covered by the insulation layers 13, and the reflection structure 143 on the main body portion 141 is accommodated in the gap between the two adjacent cell pieces. In this way, during use of the cell module, when light reaches the first bus bar 14 through glass on the cell module, the light can be reflected back to the glass by the reflection structure 143, and then reflected to the adjacent cell pieces by the glass, so that the adjacent cell pieces can absorb the light irradiated on the first bus bar 14. In this way, secondary reflection and utilization of the light irradiated on the cell module can be increased, thereby enhancing the power.

Specifically, the reflection structure 143 is a roughly textured structure, a reflective layer coated on the main body portion 141, or a reflective film attached to the main body portion. The reflective film is an aluminum film, a glass bead reflective film, or a microprism reflective film. The roughly textured structure comprises but is not limited to a mechanically polished surface, a random pyramid shape, an inverted pyramid shape, a spherical cap shape, a V-shaped groove, and a shape ranging among the above structures. The reflective layer and the reflective film may comprise a retroreflection material capable of realizing a reflection effect. The reflective layer and the reflective film are designed according to actual use requirements, which are not specifically limited herein.

Further, in an embodiment of the disclosure, the cell string further comprises second bus bars 18 located on end portions of the solar cell string. The second bus bars 18 are electrically connected to the positive electrode regions 11 and the negative electrode regions 12 in the cell pieces located on the end portions that are not covered by the insulation layers 13. Specifically, a quantity of the second bus bars 18 is two. The two second bus bars are respectively located on two ends of the two end cell pieces, and are used as two electrodes of the entire cell string. That is to say, a current guided in each positive electrode region 11 and each negative electrode region 12 on each cell piece is serially connected and converged to the two second bus bars 18 on the end portions by using each first bus bar 14. The second bus bars 18 may be electrically connected to the positive electrode regions 11 or the negative electrode regions 12 that are not covered by the insulation layers 13 by using wires, and definitely, may also be in contact with the conductive adhesives or the solder pastes 15 disposed on the first bus bar 14 to be directly connected to the cell pieces, so as to form electrical connection between the second bus bars 18 and the positive electrode regions 11 and the negative electrode regions 12 in the cell pieces located on the end portions that are not covered by the insulation layers 13. For details, refer to the above description about the electrical connection between the first bus bar 14 and the adjacent cell pieces, and the details are not described herein again.

According to this embodiment of the disclosure, the positive electrode regions and the negative electrode regions on the cell pieces that are not required to be electrically connected are covered by using the insulation layers, and the first bus bars can be directly connected to all of the positive electrode regions and the negative electrode regions on the cell pieces. The insulation layers are disposed, so that the positive electrode regions and the negative electrode regions not required to be electrically connected are insulated from the first bus bars by using the insulation layers, and the positive electrode regions and the negative electrode regions required to be electrically connected are directly electrically connected to the first bus bars. In this way, the requirement for accurate cell alignment during the manufacturing of a cell string is reduced, and the process is simplified, thereby resolving the requirement for accurate cell alignment and the complexity in a process during the manufacturing of the conventional cell string. The reflection structures are disposed on the first bus bars, so that light can be reflected back to glass in a manufactured cell module, and then reflected to an adjacent cell piece through the glass, and the adjacent cell piece can absorb the light irradiated on the first bus bars. In this way, secondary reflection and utilization of the light irradiated on the cell module can be increased, thereby enhancing the power.

Example 2

Figure 7:
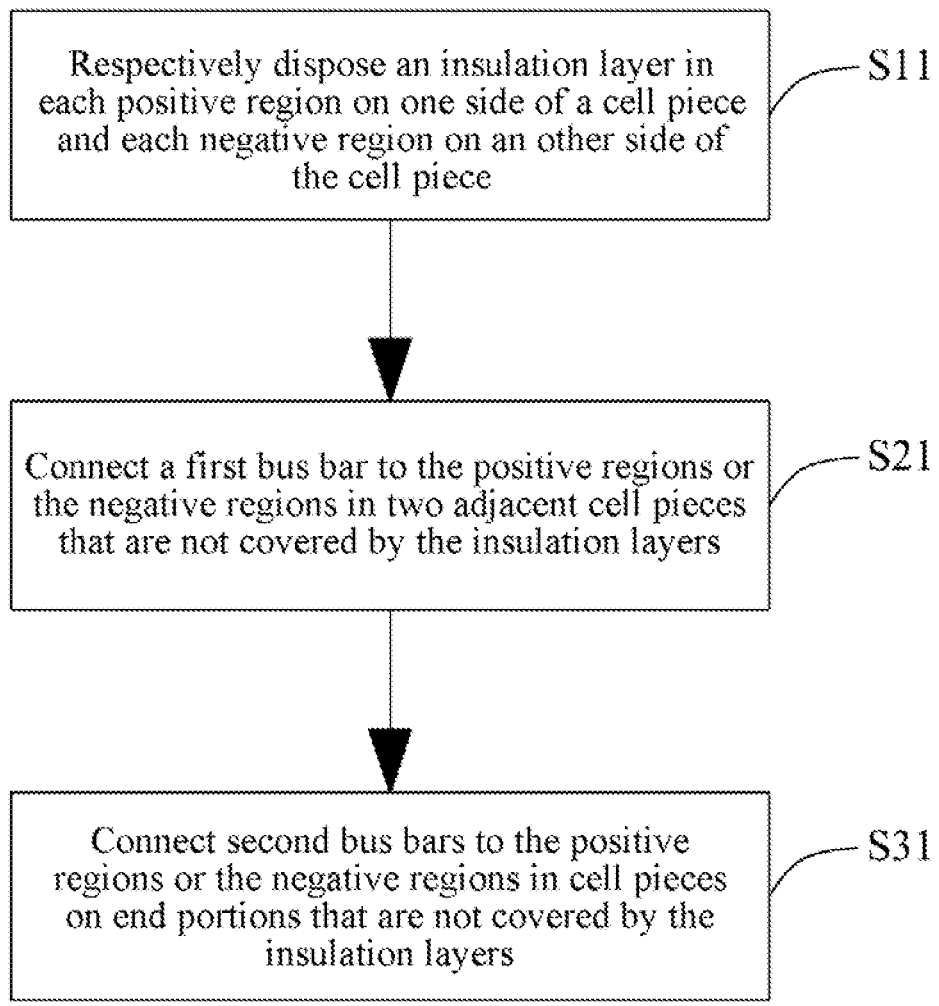
FIG. 7 is a flowchart of a method for preparing a back contact solar cell string according to another embodiment of the disclosure.

FIG. 7 is a flowchart of a method for preparing a back contact solar cell string according to a second embodiment of the disclosure. For ease of description, only parts related to this embodiment of the disclosure are shown. The preparation method is used for preparing the back contact solar cell string described in the above embodiments. Specifically, the comprises the following steps.

Step S11: Respectively dispose an insulation layer in each positive electrode region on one side of each cell piece and in each negative electrode region on another side of each cell piece.

In an embodiment of the disclosure, as shown in FIG. 1 to FIG. 5, the positive electrode regions and the negative electrode regions are alternately disposed on a back side of the cell piece. The positive electrode regions comprise P-type doped regions and positive electrode thin grid lines disposed in the P-type doped regions. The negative electrode regions comprise N-type doped regions and negative electrode thin grid lines disposed in the N-type doped regions. In order to realize serial connection between the cell pieces, one polarity on one of the cell pieces is required to be electrically connected to another polarity on the adjacent cell piece. In order to avoid a short circuit caused by the connection between the positive electrode regions and the negative electrode regions on the cell pieces during connection, insulation layers are disposed on the cell pieces to insulate the positive electrode regions or the negative electrode regions not required to be electrically connected from the outside. Specifically, for example, when the negative electrode regions on a right side of one of the cell pieces are required to be electrically connected to the outside, the insulation layers are uniformly coated to the positive electrode regions on the right side of the cell piece. Specifically, the insulation layers may comprise insulation materials such as polypropylene, polyethylene, or polyimide. The insulation layers may be coated by using a printing process, to ensure the accuracy and the quality of the coating. Definitely, the coated insulation layers may be in circular shapes, square shapes, triangular shapes, or other shapes. The insulation layers are configured to realize insulation between the positive electrode regions or negative electrode regions that are covered by the insulation layers and the outside, which are not specifically limited herein.

Step S21: Connect a first bus bar to the positive electrode regions and the negative electrode regions in two adjacent cell pieces that are not covered by the insulation layers.

In an embodiment of the disclosure, after the insulation layers are respectively disposed in the positive electrode regions on one side of the cell piece and in the negative electrode regions on another side of the cell piece, the first bus bar is connected to the positive electrode regions and the negative electrode regions in the two adjacent cell pieces that are not covered by the insulation layers. In this way, the adjacent two cell pieces are electrically connected by using the first bus bar, so as to realize serial connection.

Specifically, connecting the first bus bar to the positive electrode regions and the negative electrode regions in the two adjacent cell pieces that are not covered by the insulation layers may be implemented in the following manners.

Manner I: disposing a conductive adhesive or a solder paste in the positive electrode regions and the negative electrode regions on the cell piece that are not covered by the insulation layers; and connecting, by using the conductive adhesive or the solder paste, the first bus bar to the positive electrode regions and the negative electrode regions in the two adjacent cell pieces that are not covered by the insulation layers.

Manner II: disposing a conductive adhesive or a solder paste on the first bus bar; and connecting, by using the conductive adhesive or the solder paste, the first bus bar to the positive electrode regions and the negative electrode regions in the two adjacent cell pieces that are not covered by the insulation layers.

In Manner I, specifically, the conductive adhesives or the solder pastes are respectively coated on the positive electrode regions and the negative electrode regions on the cell pieces that are not covered by the insulation layers, and then the first bus bar is connected to the two adjacent cell pieces. The conductive adhesives or the solder pastes are melted by means of heating and welding such as hot melt welding, laser welding, infrared welding, or electromagnetic welding, and then cured, so that the first bus bar is electrically connected and physically connected to the positive electrode regions and the negative electrode regions in the two adjacent cell pieces that are not covered by the insulation layers. Manner II is substantially the same as Manner I, except that the conductive adhesives or the solder pastes are directly disposed on the first bus bar. In this case, the conductive adhesives or the solder pastes disposed on the first bus bar are merely required to be controlled not to exceed a coverage of the insulation layers.

In Manner I, the conductive adhesives or the solder pastes are required to be successively disposed in the positive electrode regions and the negative electrode regions that are not covered by the insulation layers, which is relatively cumbersome. In addition, in order to avoid a short circuit caused by the coating of the conductive adhesives or the solder pastes to the adjacent positive electrode regions or negative electrode regions covered by the insulation layers, the conductive adhesives or the solder pastes are required to be coated accurately enough. In Manner II, only the conductive adhesives or the solder pastes are required to be disposed on the first bus bar, so that a process is more convenient and rapid. Thus, in this embodiment of the disclosure, Manner II is preferably selected to connect the first bus bar to the positive electrode regions and the negative electrode regions in the two adjacent cell pieces that are not covered by the insulation layers.

Further, connecting the first bus bar to the positive electrode regions and the negative electrode regions in the two adjacent cell pieces that are not covered by the insulation layers further comprises:

disposing, on the cell pieces, busbars or wires connected to the positive electrode regions and the negative electrode regions not covered by the insulation layers; and connecting the first bus bar to the busbars or the wires in the two adjacent cell pieces.

The busbars or the wires capable of converging a current are disposed in the positive electrode regions and the negative electrode regions that are not covered by the insulation layers, so that the current in each positive electrode region or each negative electrode region that is not covered by the insulation layers can be converged to the busbars or the wires. Then the first bus bar is connected to the busbars or the wires in the two adjacent cell pieces. In this case, by means of the insulation layers, the positive electrode regions and the negative electrode regions that are covered by the insulation layers are prevented from being connected to the first bus bar, thereby realizing serial connection between the adjacent cell pieces. Specifically, the connection may be implemented in the above Manner II.

Further, connecting the first bus bar to the positive electrode regions and the negative electrode regions in the two adjacent cell pieces that are not covered by the insulation layers further comprises:

disposing solder joints in the positive electrode regions and the negative electrode regions on the cell pieces that are not covered by the insulation layers; and connecting the first bus bar to the solder joints in the positive electrode regions and the negative electrode regions in the two adjacent cell pieces that are not covered by the insulation layers.

Solder joints may also be disposed on the busbars or the wires on each cell piece. In this case, the first bus bar is connected to each solder joint, so that connection between the first bus bar and the positive electrode regions and the negative electrode regions in the two adjacent cell pieces that are not covered by the insulation layers can be realized. Specifically, the connection may be implemented in the above Manner II.

Step S31: Connect second bus bars to the positive electrode regions or the negative electrode regions in the cell pieces located on end portions that are not covered by the insulation layers.

The positive electrode regions or the negative electrode regions in the end cell pieces of the cell string that are not covered by the insulation layers are connected to the second bus bars, to converge the current collected from each cell piece to the second bus bars, so as to form the cell string. It is to be understood that, the step may be specifically electrically connecting the second bus bars to the positive electrode regions or the negative electrode regions that are not covered by the insulation layers by using the wires, or may conform to the connection manner of the first bus bar. Details are not described herein again.

Example 3

A third embodiment of the disclosure further provides a cell module. The cell module comprises the back contact solar cell string described in the above embodiments.

Specifically, an assembling process of the cell module comprises the following.

Classification of cells: since a production line of solar cell pieces is pretty random, the performance of produced cells is not exactly the same. In order to effectively combine cell pieces having same or similar performance together, the cell pieces are required to be classified according to performance parameters measured by means of a cell test, so as to improve the utilization of the cell pieces, thereby manufacturing a qualified cell module. The cell test is to test values of output parameters (currents and voltages) of the cells.

Serial connection: the cell pieces are prepared according to the preparation method described in the above method embodiments, so as to form the cell string described in the above device embodiments by means of serial connection.

Stacking: after back sides are serially connected and pass quality inspection, glass, a cut EVA film/POE film, the cell string, an EVA film/POE film, glass fiber, and a back panel/glass are stacked in sequence from bottom to top, where relative positions of the cell string and materials such as the glass are guaranteed during the stacking, and a distance between the cell pieces is adjusted.

Lamination of module: the stacked cell pieces are put into a laminator, the module is vacuumized, then EVA is heated to melt so as to bond the cells, the glass, and the back panel together, and finally, the module is cooled and then taken out.

Trimming: during the lamination, the EVA extends outward due to a pressure after being melted and cures, forming rough edges, and therefore the rough edges are required to be cut off after completion of the lamination.

Framing: an aluminum frame is assembled to the module to enhance the strength of the module, so as to further seal the cell module and prolong the service lift of the cell. Gaps between frame and the glass assembly is filled with silicone resin, and the frames are connected to each other by using key joints.

Bonding of junction box: a box is bonded to a wire on a back side of the module, so as to facilitate connection between the cell and other devices or other cells.

Test of module: an output power of the cell is tested and calibrated, and output characteristics thereof are tested, to determine a quality level of the module.

High voltage test: a specific voltage is applied between the frame of the module and the electrode wire, to test a withstand voltage and insulation strength of the module, thereby ensuring that the module is free of damage in formidable natural conditions (such as a lightning stroke).

Example 4

A fourth embodiment of the disclosure further provides a photovoltaic system. The photovoltaic system comprises the cell module described in the above embodiments.

It will be obvious to those skilled in the art that changes and modifications may be made, and therefore, the aim in the appended claims is to cover all such changes and modifications.

What is claimed is:

1. A back contact solar cell string, comprising:
at least two cell pieces, each cell piece comprising positive electrode regions and negative electrode regions alternately disposed with each other;
insulation layers, covering the positive electrode regions on one side of each cell piece and covering the negative electrode regions on another side of the each cell piece; and
a first bus bar, connected to two adjacent cell pieces and electrically connected to the positive electrode regions and the negative electrode regions in the two adjacent cell pieces that are not covered by the insulation layers;
wherein:
the first bus bar comprises:
a main body portion extending till extreme ends of the electrode regions of the two adjacent cell pieces; and
multiple pairs of protruding portions, each of the pairs of the protruding portion extending laterally from the main body portion in opposite directions, symmetrically about a longitudinal axis of the main body;
the positive electrode regions or the negative electrode regions that are not covered by the insulation layers on each side of a cell piece, are connected to each other by connecting the adjacent protruding portions on each side of the main body portion by connecting bur bars or connecting wires, wherein the connecting bus bars or the connecting wires run parallel to the longitudinal axis of the main body portion; and
the first bus bar is connected to the two adjacent cell pieces via the plurality of solder joints and the plurality of protruding portions, wherein each of the plurality of protruding portions is connected to one of the plurality of solder joints, and there is interspace between the first bus bar and each adjacent cell piece.

2. The back contact solar cell string of claim 1, wherein conductive adhesives or solder pastes are disposed at connection portions between the first bus bar and the two adjacent cell pieces.

3. The back contact solar cell string of claim 2, wherein the conductive adhesives or the solder pastes are disposed on the first bus bar.

4. The back contact solar cell string of claim 1, further comprising a reflection structure, wherein:
the reflection structure is disposed on the main body portion along the longitudinal axis of the main body portion;
a conductive adhesive or a solder paste is provided on a part of a surface of each of the protruding portion, leaving a gap on the surface of each of the protruding portion free of the conductive adhesive or the solder paste, the conductive adhesive or the solder paste establishing electrical connections with the positive electrode regions and the negative electrode regions in the two adjacent cell pieces that are not covered by the insulation layers; and
the gap on the surface of each of the protruding portion is free of the reflection structure.

5. The back contact solar cell string of claim 4, wherein the reflection structure is a roughly textured structure, a reflective layer coated on the main body portion, or a reflective film attached to the main body portion.

6. The back contact solar cell string of claim 5, wherein the reflective film is an aluminum film.

7. The back contact solar cell string of claim 4, wherein the reflection structure is located in a gap between the two adjacent cell pieces.

8. The back contact solar cell string of claim 1, wherein the insulation layers comprise insulation pastes.

9. The back contact solar cell string of claim 1, wherein the first bus bar is a pressure-sensitive conductive adhesive tape or a ribbon.

10. The back contact solar cell string of claim 1, wherein the cell string further comprises second bus bars located on end portions of the solar cell string, and the second bus bars are electrically connected to the positive electrode regions and the negative electrode regions on the cell pieces located on the end portions that are not covered by the insulation layers.

11. The back contact solar cell string of claim 1, wherein a quantity of the plurality of solder joints is in a range of 2-20.

12. A cell module, comprising the back contact solar cell string of claim 1.

13. A photovoltaic system, comprising the cell module of claim 12.

14. A method for preparing a back contact solar cell string, the method comprising:
providing at least two cell pieces, wherein each cell piece comprising positive electrode regions and negative electrode regions alternately disposed with each other;
respectively disposing insulation layers in each positive electrode region on one side of each cell piece and in each negative electrode region on another side of each cell piece;
connecting the positive electrode regions or negative electrode regions that are not covered by the insulation layers on each side of a cell piece to each other via busbars or wires;
disposing a plurality of solder joints on the busbars or wires; and connecting a first bus bar to positive electrode regions and negative electrode regions in two adjacent cell pieces that are not covered by the insulation layers, wherein: the first bus bar comprises:
- a main body portion extending till extreme ends of the electrode regions of the two adjacent cell pieces; and
- multiple pairs of protruding portions, each of the pairs of the protruding portion extending laterally from the main body portion in opposite directions, symmetrically about a longitudinal axis of the main body;

the positive electrode regions or negative electrode regions that are not covered by the insulation layers on each side of a cell piece, are connected to each other by connecting the adjacent protruding portions on each side of the main body portion by connecting bus bars or connecting wires, wherein the connecting bus bars or the connecting wires run parallel to the longitudinal axis of the main body portion; and each of the plurality of protruding portions is connected to one of the plurality of solder joints, and there is interspace between the first bus bar and each adjacent cell piece.

15. The method of claim 14, wherein connecting the first bus bar to the positive electrode regions and the negative electrode regions in the two adjacent cell pieces that are not covered by the insulation layers comprises:
- disposing a conductive adhesive or a solder paste on the first bus bar; and
- connecting, by using the conductive adhesive or the solder paste, the first bus bar to the two adjacent cell pieces.

16. The method of claim 14, wherein connecting the first bus bar to the positive electrode regions and the negative electrode regions in the two adjacent cell pieces that are not covered by the insulation layers comprises:
- connecting the first bus bar to the plurality of solder joints in the two adjacent cell pieces.

17. The method of claim 14, further comprising:
- connecting second bus bars to the positive electrode regions or the negative electrode regions in each cell piece located on end portions that are not covered by the insulation layers.

\* \* \* \* \*